(12) United States Patent
Takeuchi

(10) Patent No.: US 7,164,372 B2
(45) Date of Patent: Jan. 16, 2007

(54) SERIAL TRANSMISSION SYSTEM, ITS TRANSMISSION-SIDE CIRCUIT, AND ITS RECEPTION-SIDE CIRCUIT

(75) Inventor: Seiji Takeuchi, Isehara (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 1 day.

(21) Appl. No.: 11/062,441

(22) Filed: Feb. 23, 2005

(65) Prior Publication Data

US 2005/0185721 A1 Aug. 25, 2005

(30) Foreign Application Priority Data

Feb. 25, 2004 (JP) .............................. 2004-049878

(51) Int. Cl.
*H03M 9/00* (2006.01)
(52) U.S. Cl. ...................... 341/100; 341/101; 375/257
(58) Field of Classification Search ................ 341/100, 341/101
See application file for complete search history.

(56) References Cited

U.S. PATENT DOCUMENTS

2003/0095057 A1* 5/2003 Gredone et al. ............ 341/100

FOREIGN PATENT DOCUMENTS

| JP | 11-313114 | | 11/1999 |
|---|---|---|---|
| JP | 2000338938 | A * | 12/2000 |
| JP | 2002-237853 | | 8/2002 |

* cited by examiner

*Primary Examiner*—Howard L. Williams
(74) *Attorney, Agent, or Firm*—Finnegan, Henderson, Farabow, Garrett & Dunner, L.L.P.

(57) ABSTRACT

In an LVDS system for converting N types (for example N=3) of parallel signals into serial signals and sending/receiving the converted serial signals between a driver and a receiver through M (M≦N) signal lines, a sequencer 11 for selecting drivers 10a to 10c to be used in accordance with the number of signal lines used for transmission/reception and a reception-side sequencer for selecting a receiver to be used in accordance with the number of signal lines M used for transmission/reception are included to perform transmission/reception by using the driver and receiver selected by the both sequencers. Thus, it is possible to select the number of channels and a data rate optimum for the impedance of a signal line without fixing the number of signal lines used for transmission/reception.

8 Claims, 9 Drawing Sheets

FIG. 9
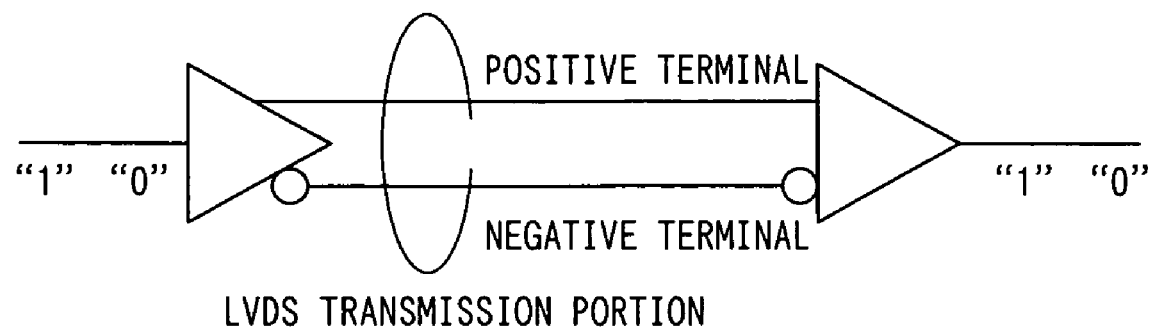
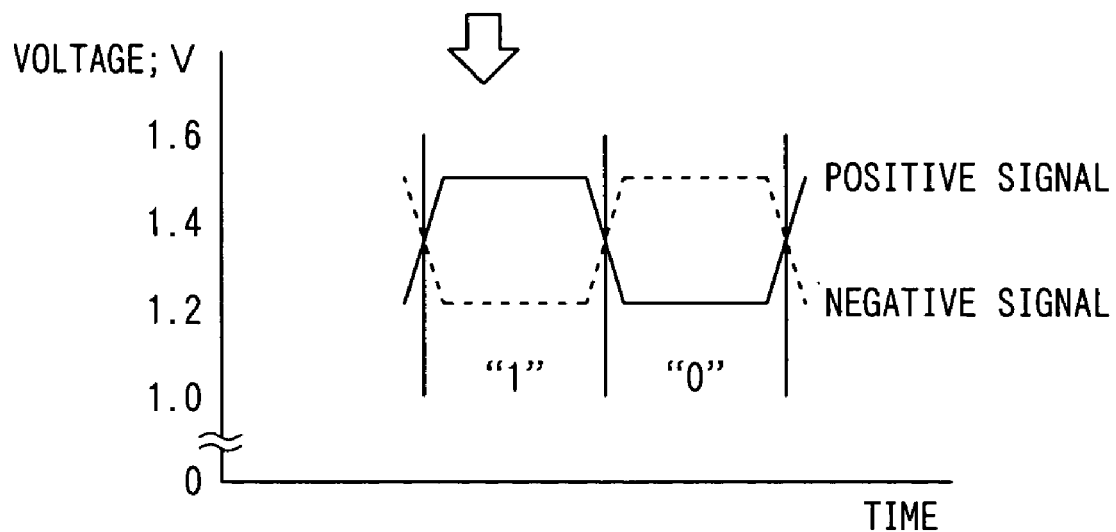

SERIAL TRANSMISSION SYSTEM, ITS TRANSMISSION-SIDE CIRCUIT, AND ITS RECEPTION-SIDE CIRCUIT

FIELD OF THE INVENTION

The present invention relates to a serial transmission system such as a differential signal transmission system (Low Voltage Differential Signaling; hereafter referred to as LVDS), its transmission-side circuit, and its reception-side circuit, particularly to a system for converting a parallel signal of a plurality of bits into a serial signal, transmitting the signal, and returning the signal to the original parallel signal after receiving it and its transmission/reception circuit.

BACKGROUND OF THE INVENTION

When transmitting a pulse signal through an electrical wire, an LVDS system is known as a transmission method for preventing a signal error due to the influence of external noises on the electrical wire (for example, JP2002-237853A) In the case of this LVDS system, a transmission-side circuit transmits a pulse signal to be transmitted as two pulse signals of a positive phase (+side) and negative phase (−side) (that is, as a differential signal). A transmission line of a pair of two lines is frequently used for transmission. Moreover, the receiving-side circuit obtains an original pulse signal by receiving two pulse signals as differential inputs.

For example, when the level of a +signal transmitted from the transmission-side circuit to the reception-side circuit is higher than the level of a −signal as shown in FIG. 9 in the case of JP11-313114A, the level becomes "1" but when the level of the −signal is higher than the level of the +signal, the level becomes "0". In JP11-313114A, a signal level has either of 1.2 V and 1.5 V.

In the case of the conventional LVDS system described above, the number of signal lines used to send/receive a serial signal is fixed. This case has a disadvantage that it is impossible to select the number of channels and a data rate optimum for the impedance of a signal line used for transmission/reception.

The present invention is made to solve the problems of the above prior art and its object is to provide an LVDS system capable of selecting the number of channels and a data rate optimum for the impedance of a signal line for transmission/reception, its transmission-side circuit, and it reception-side circuit.

SUMMARY OF THE INVENTION

A serial transmission system of the present invention is an LVDS system for converting N (N is a natural number; the same is applied hereafter) types of parallel signals into serial signals and sending/receiving the converted serial signals between a driver and a receiver through M (M≦N; the same is applied hereafter) signal lines, includes transmission-side switching selection means for selecting a driver to be used in accordance with the number of signal lines M used for transmission/reception and reception-side switching selection means for selecting a receiver to be used in accordance with the number of signal lines M used for transmission/reception, and performs transmission/reception by using a driver and receiver selected by the transmission-side switching selection means and reception-side switching selection means. According to this configuration, it is possible to select the number of channels and a data rate optimum for the impedance of a signal line without fixing the number of signals used for transmission/reception. Moreover, it is possible to switch transmission speeds and the number of channels in accordance with the transmission speed of a signal line using a transmission system. Therefore, it is possible to use an optimum transmission speed without changing transmission-side devices and reception-side devices.

Moreover, the following means are included: parallel-serial conversion means set correspondingly to the N types of parallel signals at the signal transmission side to convert a corresponding parallel signal into a serial signal and serial-parallel conversion means for converting the serial signals converted by the parallel-serial conversion means into the N types of parallel signals at the signal reception side and the transmission-side switching selection means performs the switching selection operation so as to input the serial signals converted by the parallel-serial conversion means and the reception-side selection means. The reception-side switching selection means performs the switching selection operation so as to input a serial signal received by a selected receiver to the serial-parallel conversion means.

According to the above configuration, because it is possible to send/receive N types of parallel signals converted into serial signals and return the serial signals to the original parallel signals, it is possible to select the number of channels and a data rate optimum for the impedance of a signal line used for transmission/reception.

A transmission-side circuit used by a serial transmission system of the present invention is a transmission-side circuit of the serial transmission system for converting N types (N is a natural number; the same is applied hereafter) of parallel signals into serial signals and sending/receiving the converted serial signals between a driver and a receiver through M (M≦N; the same is applied hereafter) signal lines, which includes transmission-side switching selection means for selecting a driver to be used in accordance with the number of signal lines M used for transmission/reception and performs transmission by using the driver selected by the transmission-side switching selection means.

According to the above configuration, it is possible to select and transmit the number of channels and a data rate optimum for the impedance of a signal line without fixing the number of signal lines used for transmission.

Moreover, the following means is further included: parallel-serial conversion means set correspondingly to each of the N types of parallel signals to convert a corresponding parallel signal into a serial signal. The transmission-side switching selection means performs the switching selection operation so as to input serial signals converted by the parallel-serial conversion means to a selected driver.

According to the above configuration, it is possible to transmit N types of parallel signals converted into serial signals and return the signals to original parallel signals at the reception side. Therefore, it is possible to select the number of channels and a data rate optimum for the impedance of a signal line used for transmission.

A reception-side circuit of a serial transmission system of the present invention is a reception-side circuit of a serial transmission system for converting N types (N is a natural number; the same is applied hereafter) of parallel signals into serial signals and sending/receiving the converted serial signals between a driver and a receiver through M (M≦N, the same is applied hereafter) signal lines, which includes reception-side switching selection means for selecting a receiver to be used in accordance with M signal lines used for transmission/reception and performs reception in accordance with the receiver selected by the reception-side switching selection means.

According to the above configuration, it is possible to select and receive the number of channels and a data rate optimum for the impedance of a signal line without fixing the number of signal lines used for reception.

Moreover, serial-parallel conversion means for converting the serial signals converted by the parallel-serial conversion means into the N types of parallel signals is further included and the reception-side switching selection means performs the switching selection operation so as to input the serial signals received by the selected receiver to the serial-parallel conversion means.

According to the above configuration, it is possible to transmit N types of parallel signals converted into serial signals and return the serial signals to the original parallel signals at the reception side. Therefore, it is possible to select the number of channels and a data rate optimum for the impedance of a signal line used for reception.

It is preferable to use a differential signal transmission system (Low Voltage Differential Signaling System) as a serial transmission system.

According to the present invention, a driver to be used is selected in accordance with the number of signal lines used for transmission/reception and a receiver to be used is selected in accordance with the number of signal lines used for transmission/reception to perform transmission/reception by using the selected driver and receiver. Therefore, it is possible to select the number of channels and a data rate optimum for the impedance of a signal line used for transmission/reception.

BRIEF DESCRIPTION OF THE DRAWING

FIG. 9 is an illustration showing an example of voltage levels of differential signals.

DETAILED DESCRIPTION OF THE INVENTION

An embodiment of the present invention is described below by referring to the accompanying drawings. For drawings to be referenced in the following description, a portion equivalent to that of other drawings is provided with the same symbol. In this case, a configuration of the transmission-side circuit and reception-side circuit of an LVDS system of the present invention are described.

(Configuration of Transmission-Side Circuit)

Figure 1:
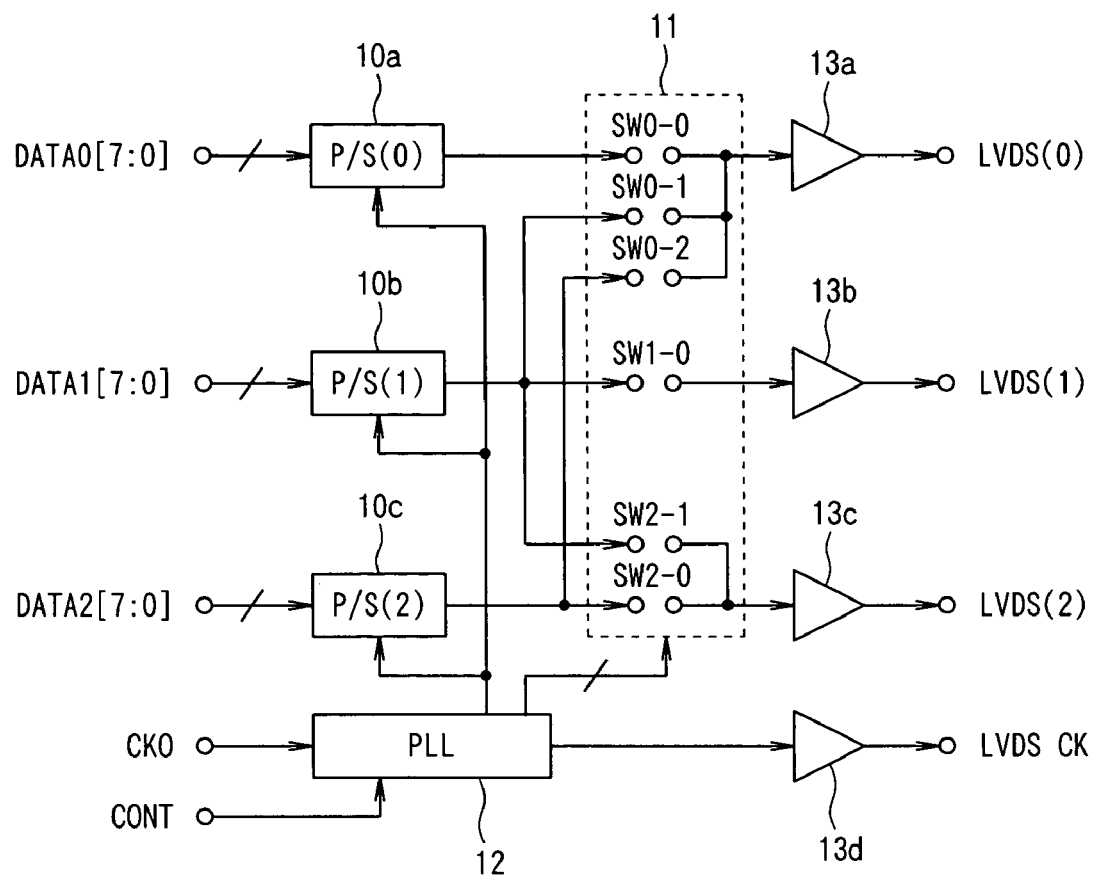
FIG. 1 is a block diagram showing an embodiment of a transmission-side circuit of an LVDS system of the present invention.

FIG. 1 is a block diagram showing an embodiment of a transmission-side circuit of an LVDS system of the present invention. As shown in FIG. 1, the transmission-side circuit of the LVDS system of this embodiment is constituted by including;

parallel/serial (P/S) conversion circuits 10a to 10c for respectively converting a parallel signal into a serial signal, a PLL (Phase Locked Loop) circuit 12 for outputting an LVDS clock obtained by multiplying a clock signal CK0 used as an input, drivers 13a to 13d set correspondingly to the parallel/serial conversion circuits 10a to 10c and PLL circuit 12, and a sequencer circuit 11 for selecting outputs of the parallel/serial conversion circuits 10a to 10c and inputting the outputs to the drivers 13a to 13c.

The data values to be input in this example are three types (N=3) of parallel digital data values DATA0 to DATA2. Each of the digital data values DATA0 to DATA2 is parallel data of 8 bits from [0] to [7] (in FIG. 1, [7] to [0] are described as [7:0]). Switches SW0-0 to SW0-2, switch SW1-0, and switches SW2-0 to SW2-1 are set in the sequencer circuit 11 correspondingly to three types of digital data values DATA0 to DATA2. These switches are switching-controlled by outputs of the PLL circuit 12.

Outputs of the drivers 13a to 13c are three types of serial data values LVDS(0) to LVDS(2). Moreover, an output of the driver 13d is a 1-bit clock LVDSCK. In the case of the transmission-side circuit of the LVDS system of this example, an operation mode is decided by a control signal CONT and the number of bits of the serial data output in accordance with the selected operation mode is decided. The control signal CONT is a signal for selecting a data rate for one channel. The PLL circuit 12 is controlled by the control signal CONT and a necessary clock is distributed to the parallel/serial conversion circuits 10a to 10c.

(Operations of Transmission-Side Circuit)

Figure 2:
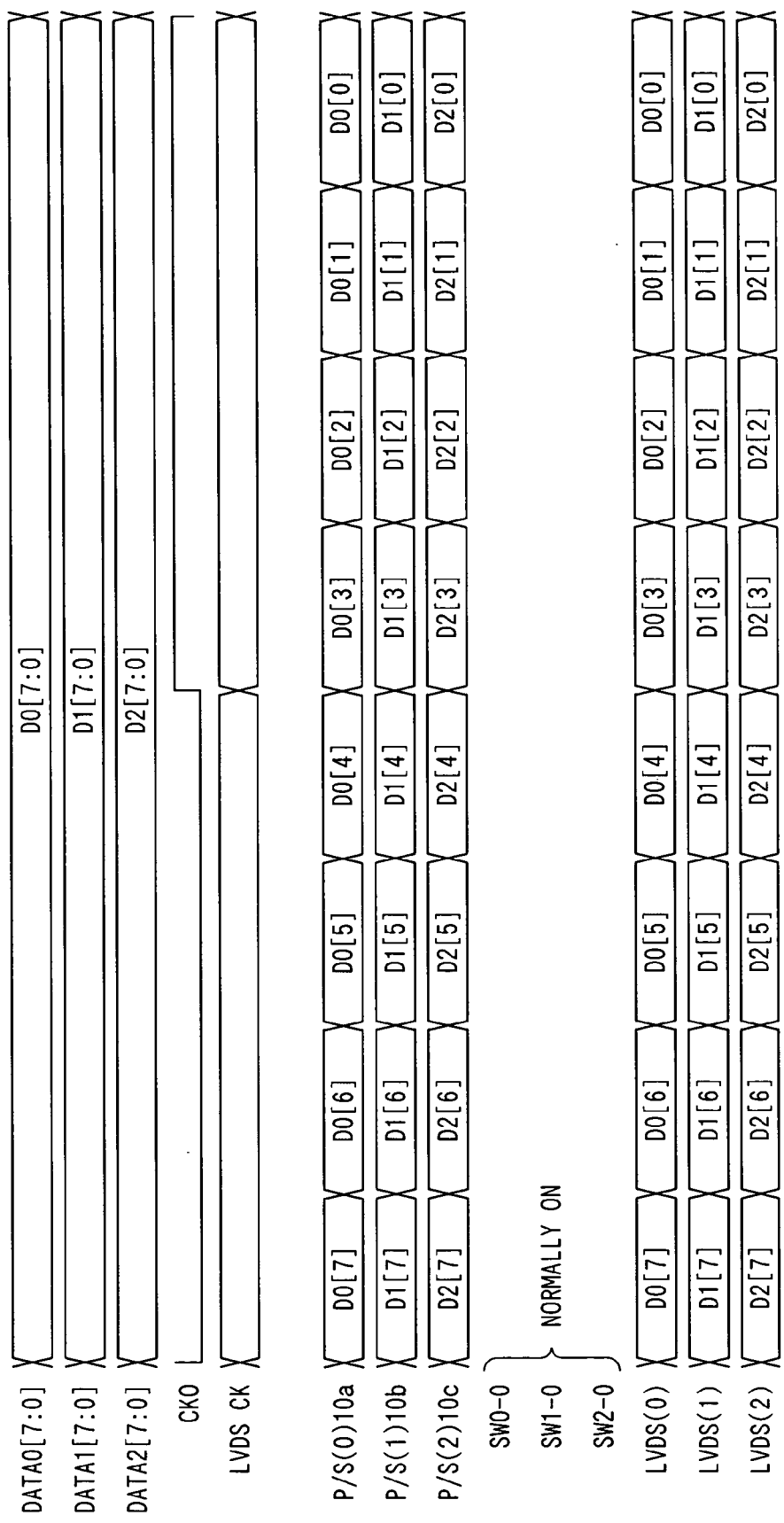
FIG. 2 is a time chart showing operations for transmitting three types of parallel data values as serial data through three signal lines.
Figure 3:
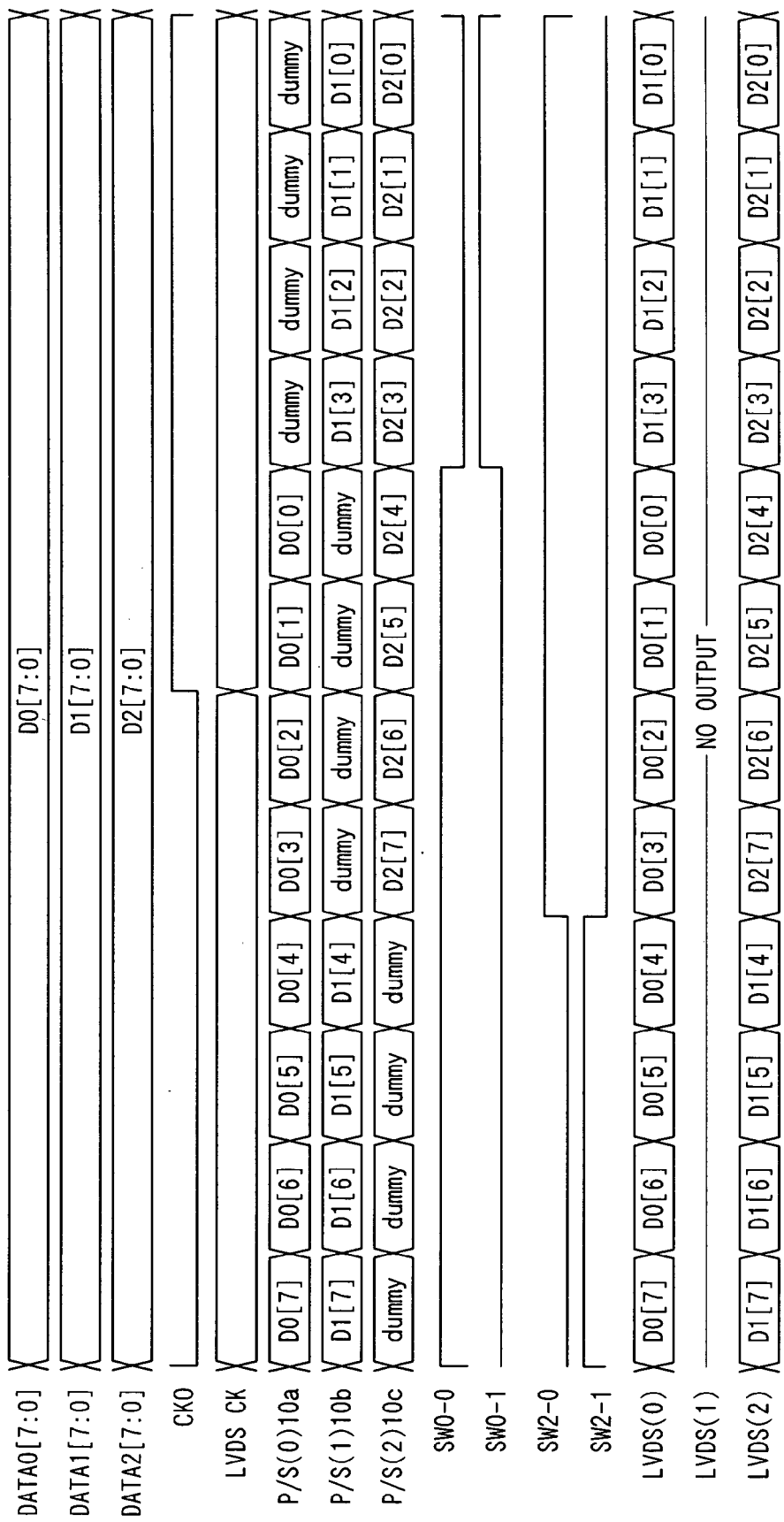
FIG. 3 is a time chart showing operations for transmitting three types of parallel data values as serial data through two signal lines.
Figure 4:
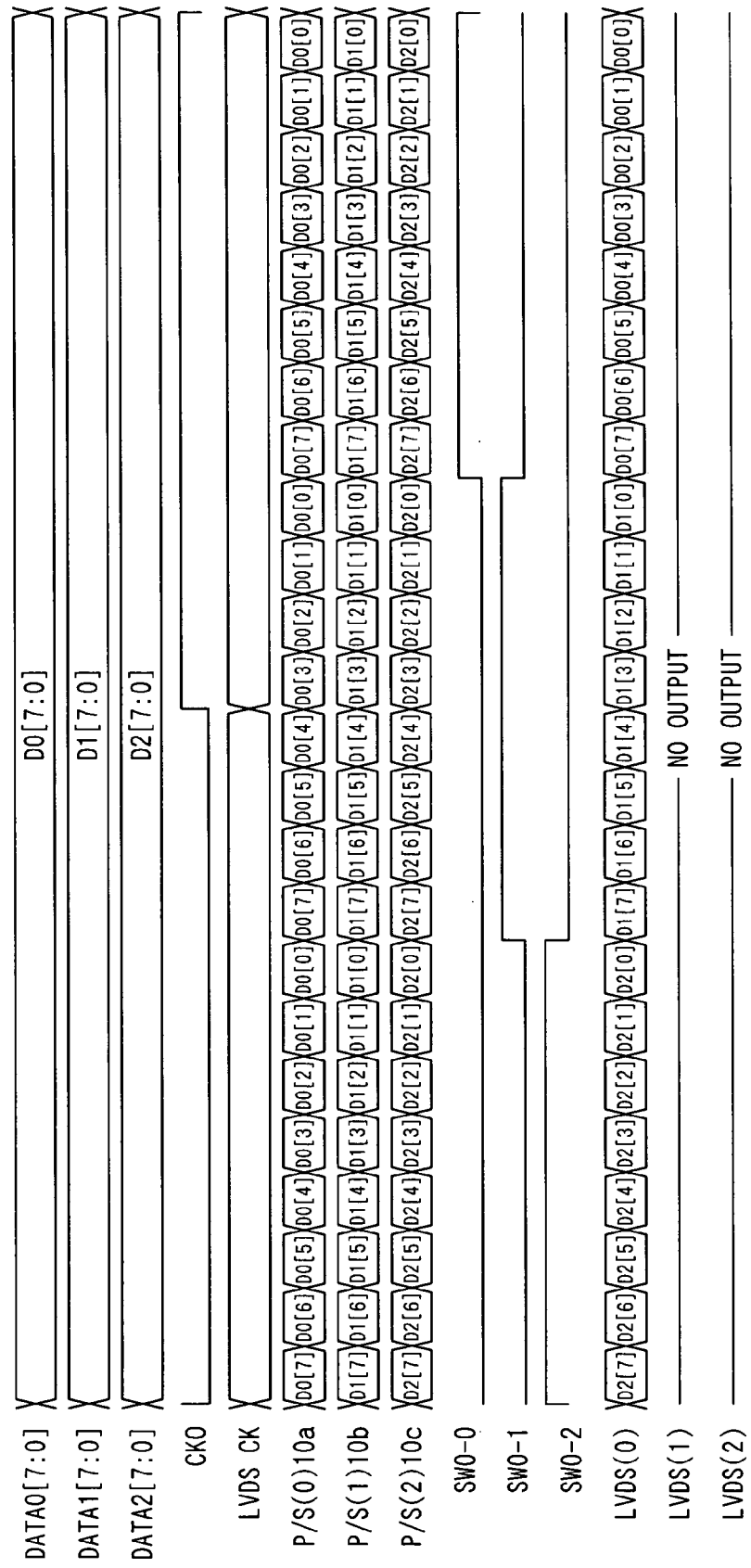
FIG. 4 is a time chart showing operations for transmitting three types of parallel data values as serial data through one signal line.

FIGS. 2 to 4 are time charts showing operations of various portions in FIG. 1. A case is described below in which three types (N=3) of parallel data values are transmitted as serial data.

(Transmission as Serial Data Through Three Signal Lines)

FIG. 2 is a time chart showing operations for transmitting three types (N=3) of parallel data values as serial data through three (M=3) signal lines. FIG. 2 shows three types of 8-bit parallel digital data values DATA0 to DATA2, clock CK0, LVDSCK, output signals of parallel/serial conversion circuits 10a to 10c, switching selection operations of switches SW0-0 to SW2-0 in sequencer circuit 11, and LVDS(0) to LVDS(2).

Eight-bit parallel digital data DATA0 is input to the parallel/serial conversion circuit 10a and converted into a serial signal. Contents of digital data DATA0 are data D0[7] to D0[0]. Therefore, as shown in FIG. 2, a serial signal output from the parallel/serial conversion circuit 10a changes from data D0[7] to D0[0].

Eight-bit parallel digital data DATA1 is input to the parallel/serial conversion circuit 10b and converted into a serial signal. Contents of digital data DATA1 are data D1[7] to D1[0]. Therefore, as shown in FIG. 2, a serial signal output from the parallel/serial conversion circuit 10b changes from data D1[7] to D1[0].

Eight-bit parallel digital data DATA2 is input to the parallel/serial conversion circuit 10c and converted into a serial signal. Contents of digital data DATA2 are data D2[7] to D2[0]. Therefore, as shown in FIG. 2, a serial signal output from the parallel/serial conversion circuit 10c changes from data D2[7] to D2[0].

In the case of this example, switches SW0-0 to SW2-0 in the sequencer circuit 11 are always kept turned-on. Therefore, in the case of this example, data is transmitted by three types of signals LVDS(0) to LVDS(2). That is, LVDS(0) which is an output of the driver 13a changes from data D0[7] to D0[0] and the content of digital data DATA0 is transmitted. Moreover, LVDS(1) which is an output of the driver 13b changes from data D1[7] to D1[0] and the content of digital data DATA1 is transmitted. Furthermore, LVDS(2) which is an output of the driver 13c changes from data D2[7] to D2[0] and the content of digital data DATA2 is transmitted.

As described above, in the case of this example, three types (N=3) of 8-bit parallel digital data values are transmitted as serial data through three (M=3) signal lines. LVDSCK synchronizing with the clock CK0 is also output from the driver 13d and transmitted.

(Transmission as Serial Data Through Two Signal Lines)

FIG. 3 is a time chart showing operations for transmitting three types (N=3) of parallel data values as serial data through two (M=2) signal lines. FIG. 3 shows three types of 8-bit parallel digital data values DATA0 to DATA2, clock CK0, LVDSCK, output signals of parallel/serial conversion circuits 10a to 10c, switching selection operations of switches SW0-0 to SW2-1 in sequencer circuit 11, and LVDS(0) to LVDS(2).

Eight-bit parallel digital data DATA0 is input to the parallel/serial conversion circuit 10a and converted into a serial signal. Contents of digital data DATA0 are data D0[7] to D0[0]. Therefore, as shown in FIG. 3, a serial signal output from the parallel/serial conversion circuit 10a changes from data D0[7] to D0[0]. However, thereafter, a serial signal output from the parallel/serial conversion circuit 10a becomes dummy data "dummy" for four slots after the timing at which the switch SW0-0 is changed from on to off.

Eight-bit parallel digital data DATA1 is input to the parallel/serial conversion circuit 10b. Contents of digital data DATA1 are data D1[7] to D1[0]. Therefore, as shown in FIG. 3, a serial signal output from the parallel/serial conversion circuit 10b changes from data D1[7] to D1[0]. Moreover, serial a signal output from the parallel/serial conversion circuit 10b becomes dummy data "dummy" for four slots after the timing at which the switch SW2-0 changes from off to on and the switch SW2-1 changes from on to off. Thereafter, a serial signal output from the parallel/serial conversion circuit 10b changes from data D1[3] to D1[0] after the timing at which the switch SW0-0 changes from on to off and the switch SW0-1 changes from off to on.

Eight-bit parallel digital data DATA2 is input to the parallel/serial conversion circuit 10c and converted into a serial signal. Contents of digital data DATA2 are data D2[7] to D2[0]. As shown in FIG. 3, the first portion of a serial signal output from the parallel/serial conversion circuit 10c becomes dummy data "dummy" for four slots. Moreover, a serial signal output from the parallel/serial conversion circuit 10c changes from data D2[7] to D2[0] after the timing at which the switch SW2-0 changes from off to on and the switch SW2-1 changes from on to off.

In this case, the switches SW0-2 and SW1-0 in the sequencer circuit 11 are kept in a turned-off state. Therefore, in the case of this example, data is transmitted by LVDS(0) and LVDS(2) which are two types of signals. That is, LVDS(0) which is an output of the driver 13a changes from data D0[7] to D0[0] and then, changes from data D1[3] to D1[0] which are contents of digital data DATA1. Moreover, LVDS(2) which is an output of the driver 13c changes from data D1[7] to D1[4] and then, changes from data D2[7] to D2[0] which are which are contents of digital data DATA2. LVDS(1) which is an output of the driver 13b is not output.

As described above, in the case of this example, three types of 8-bit parallel digital data values are transmitted as serial data by two signal lines. Moreover, LVDSCK synchronizing with the clock CK0 is output from the driver 13d and transmitted.

(Transmission as Serial Data Through One Signal Line)

FIG. 4 is a time chart showing operations for transmitting three types (N=3) of parallel data values as serial data through one (M=1) signal line. FIG. 4 shows three types of 8-bit parallel digital data values DATA0 to DATA2, clock CK0, LVDSCK, output signals of the parallel/serial conversion circuits 10a to 10c, switching selection operations of the switches SW0-0 to SW0-2 in the sequencer circuit 11, and LVDS(0) to LVDS(2).

Eight-bit parallel digital data DATA0 is input to the parallel/serial conversion circuit 10a and converted into a serial signal. Contents of the digital data DATA0 are data D0[7] to D0[0]. Therefore, as shown in FIG. 4, a serial signal output from the parallel/serial conversion circuit 10a changes from data D0[7] to D0[0].

Eight-bit parallel digital data DATA1 is input to the parallel/serial conversion circuit 10b and converted into a serial signal. Contents of the digital data DATA1 are data D1[7] to D1[0]. Therefore, as shown in FIG. 4, a serial signal output from the parallel/serial conversion circuit 10b changes from data D1[7] to D1[0].

Eight-bit parallel digital data DATA2 is input to the parallel/serial conversion circuit 10c and converted into a serial signal. Contents of the digital data DATA2 are data D2[7] to D2[0].

In the case of this embodiment, the switch SW0-2 is changed from on to off at the timing at which the switch SW0-1 in the sequencer circuit 11 changes from off to on. Moreover, the switch SW0-1 changes from on to off at the timing at which the switch SW0-0 changes from off to on. Because this switch switching is performed, LVDS(0) which is an output of the driver 13a changes from data D2[7] to D2[0] which are contents of the digital data DATA2 and then, changes from data D1[7] to D1[0] which are contents of the digital data DATA1, and moreover changes from data D0[7] to D0[0] which are contents of the digital data DATA0. However, LVDS(1) which is an output of the driver 13b and LVDS(2) which is an output of the driver 13c are not output.

As described above, in the case of this example, three types of 8-bit parallel data values are transmitted as serial data by one signal line. LVDSCK synchronizing with the clock CK0 is output from the driver 13d and transmitted.

(Configuration of Reception-Side Circuit)

Figure 5:
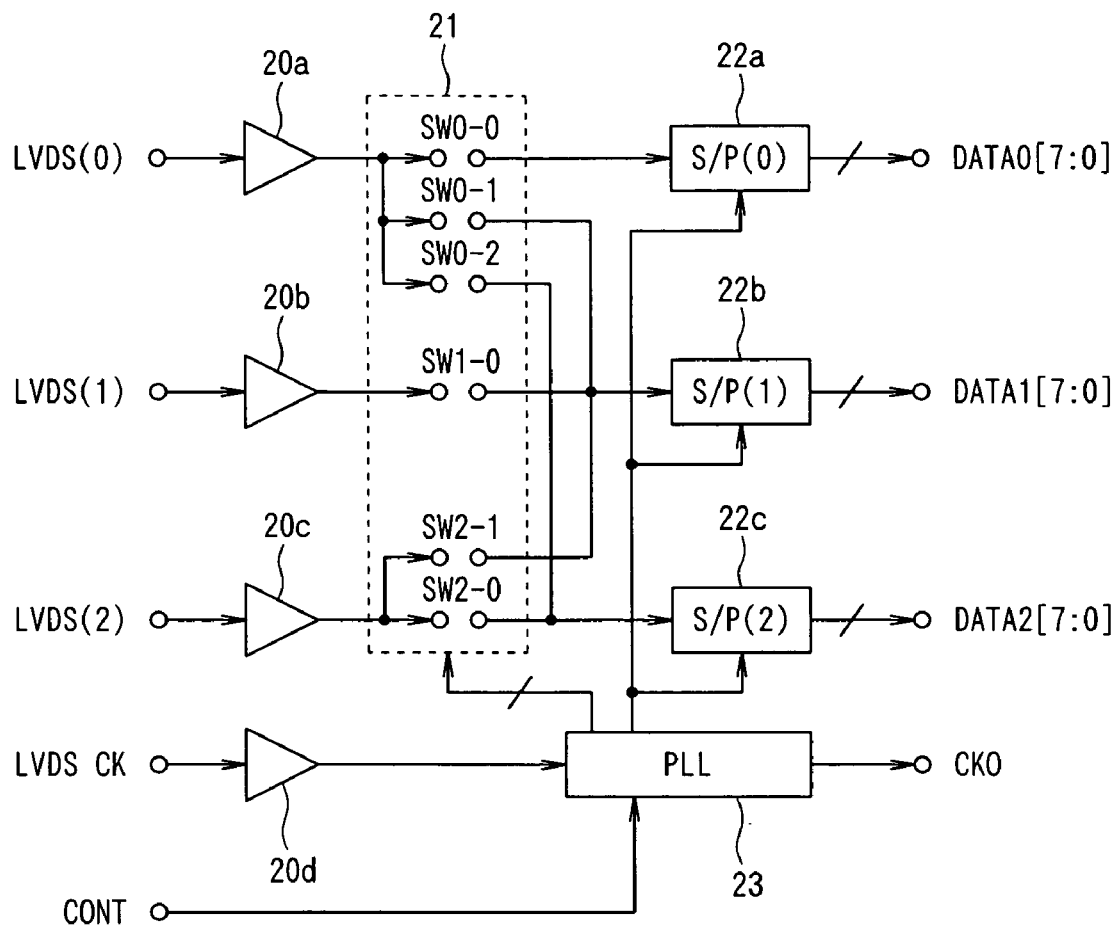
FIG. 5 is a block diagram showing an embodiment of a reception-side circuit of an LVDS system of the present invention.

FIG. 5 is a block diagram showing an embodiment of a reception-side circuit of an LVDS system of the present invention. As shown in FIG. 5, the reception-side circuit of the LVDS system of this embodiment is constituted by including receivers 20a to 20d set correspondingly to transmitted serial data values LVDS(0) to LVDS(2) and clock LVDSCK, PLL circuit 23 for using an output of the receiver 20d as an input and outputting a clock signal CK0 obtained by dividing the input, serial/parallel (S/P) conversion circuits 22a to 22c for respectively converting a serial signal into a parallel signal, and a sequencer circuit 21 for performing the switching selection operation for selecting outputs of the receivers 20a to 20c and inputting them to serial/parallel conversion circuits 22a to 22c.

Outputs of the serial/parallel conversion circuits 22a to 22c become three types (N=3) of parallel digital data values DATA0 to DATA2. Each of the digital data values DATA0 to DATA2 is 8-bit parallel data from [0] to [7] (In FIG. 5, [7] to [0] are described as [7:0]). An output of the PLL circuit 23 is a clock CK.

In the case of this example, the data transmitted from a transmission-side circuit and received is digital data according to a serial signal. There are three cases in which all of the serial signals LVDS(0) to LVDS(2) are sent in accordance with the switching selection operation of the sequencer circuit 11 of a transmission-side circuit, serial signals LVDS (0) and LVDS(2) are sent, and only serial signal LVDS(0) is sent. Switches SW0-0 to SW0-2, switch SW1-0, and switches SW2-0 and SW2-1 are set to the sequencer circuit 21 correspondingly to serial signals LVDS(0) to LVDS(2). These switches are switching-controlled by outputs of the PLL circuit 23. A control signal CONT is a signal for selecting a data rate for one channel. The PLL circuit 12 is controlled by the control signal CONT and a necessary clock is distributed to the serial/parallel conversion circuits 22a to 22c.

(Operations of Reception-Side Circuit)

Figure 6:
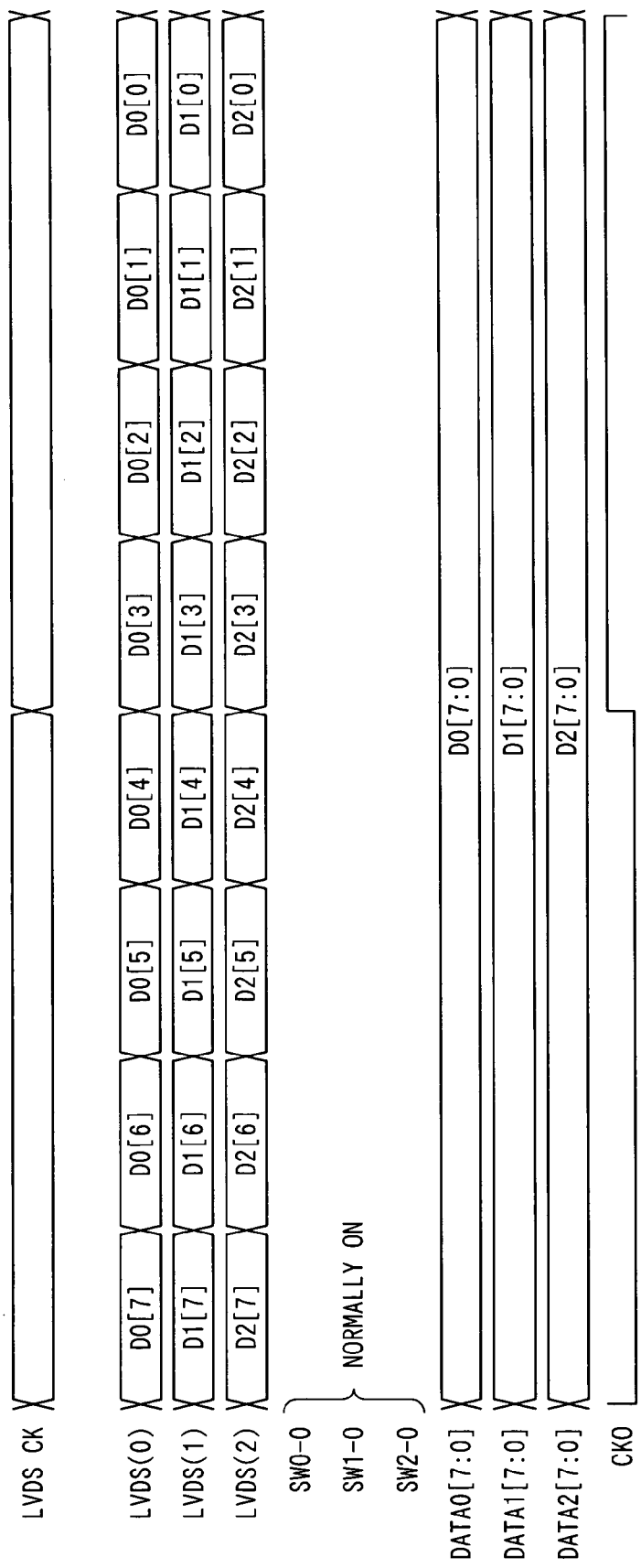
FIG. 6 is a time chart showing operations for receiving serial data by three signal lines and outputting three types of 8-bit parallel data values.
Figure 7:
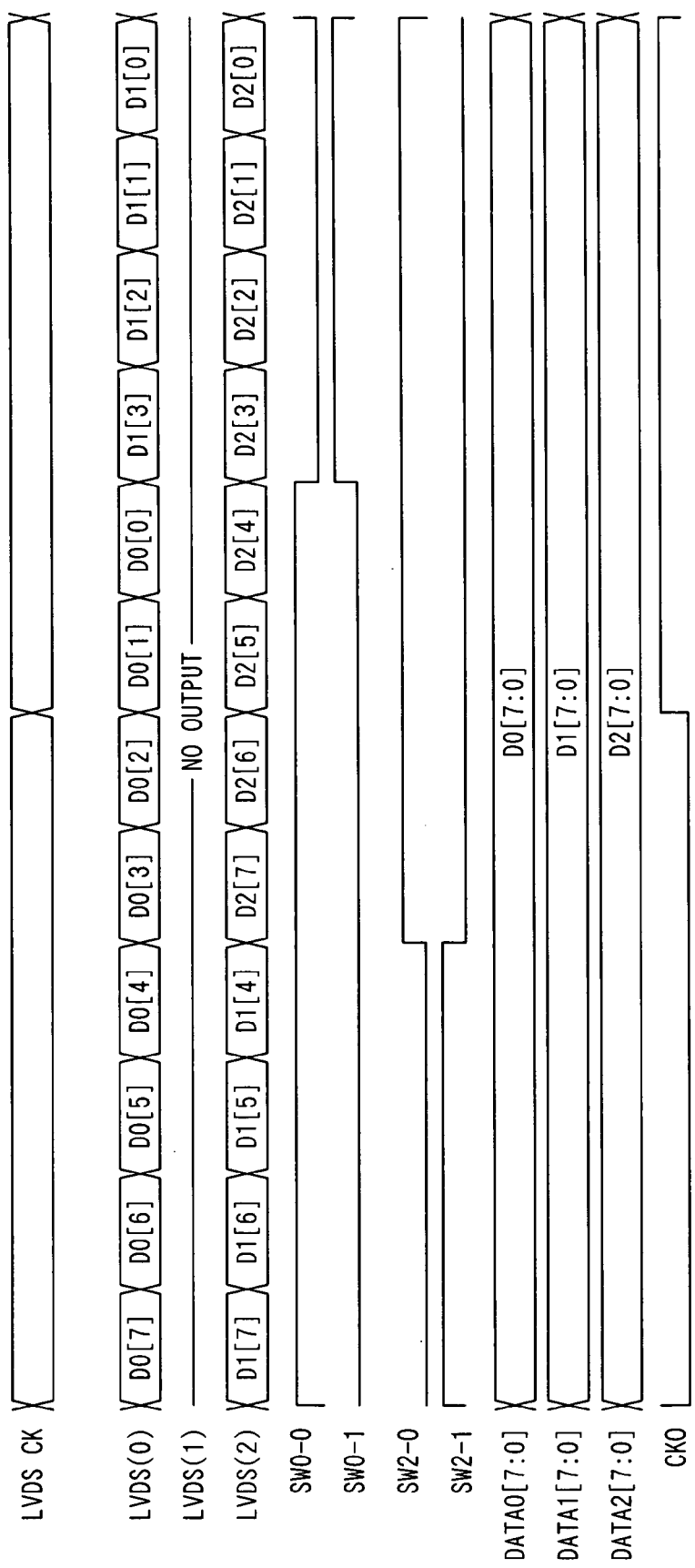
FIG. 7 is a time chart showing operations for receiving serial data by two signal lines and outputting three types of 8-bit parallel data values.
Figure 8:
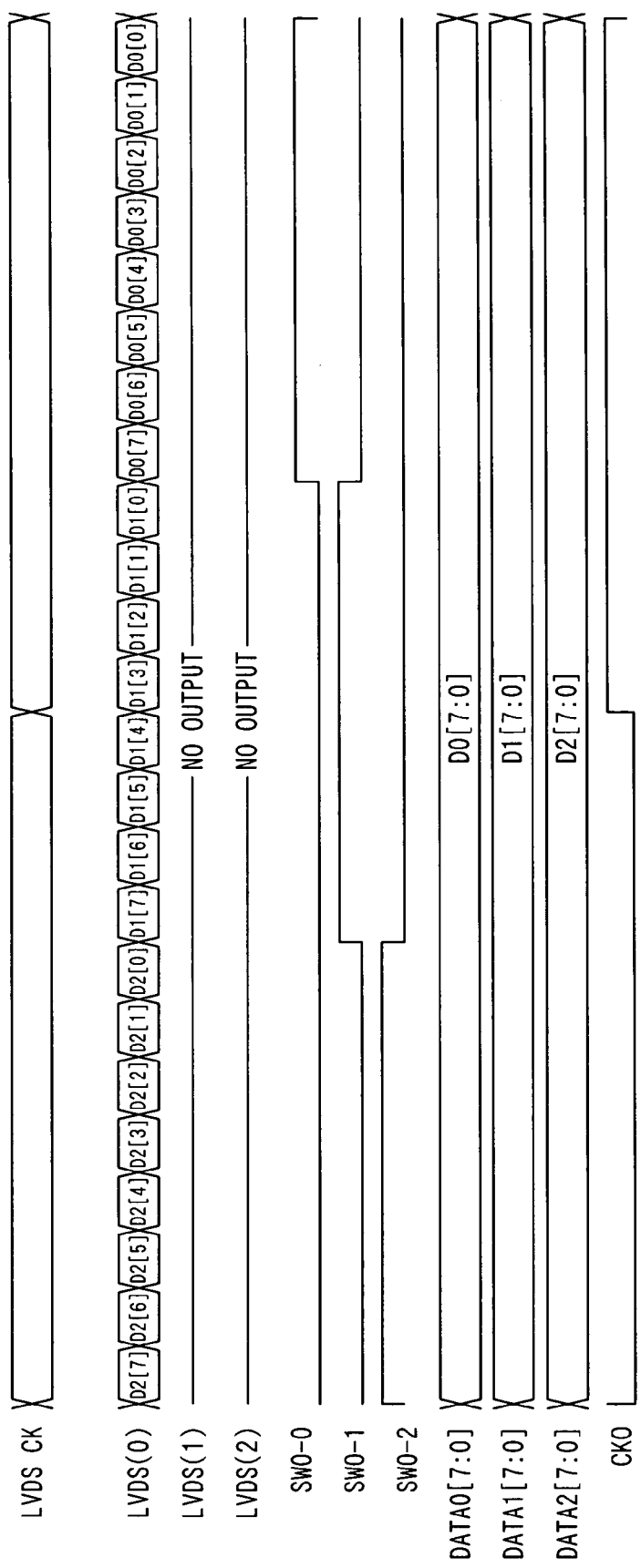
FIG. 8 is a time chart showing operations for receiving serial data by one signal line and outputting three types of 8-bit parallel data values.

FIGS. 6 to 8 are time charts showing operations of various portions in FIG. 5. A case of receiving serial data and returning the data to the original parallel data is described by referring to these drawings.

(Reception of Serial Data by Three Signal Lines)

FIG. 6 is a time chart showing operations for receiving serial data by three (M=3) signal lines and outputting three types of 8-bit parallel data values. FIG. 6 shows LVDS(0) to LVDS(2) input to receivers 20a to 20d, switching selection operations of switches SW0-0 to SW2-0 in sequencer circuit 21, three types of 8-bit parallel digital data values DATA0 to DATA2, and clock CK0.

LVDS(0) to be input to the receiver 20a is a serial signal changing from data D0[7] to D0[0]. Moreover, LVDS(1) input to the receiver 20b is a serial signal changing from data D1[7] to D1[0]. Furthermore, LVDS(2) to be input to the receiver 20c is a serial signal changing from data D2[7] to D2[0].

In the case of this example, the switches SW0-0 to SW2-0 in the sequencer circuit 11 are always turned on. Therefore, in the case of this example, three types of signals LVDS(0) to LVDS(2) are converted into parallel signals by serial/parallel conversion circuits 22a to 22c. Therefore, original 8-bit parallel digital data values DATA0[7]-[0], digital data DATA1[7]-[0], and digital data DATA2[7]-[0] are obtained by outputs of the serial/parallel conversion circuits 22a to 22c.

(Reception of Serial Data by Two Signal Lines)

FIG. 7 is a time chart showing operations for receiving serial data by two (M=2) signal lines and outputting three types of 8-bit parallel data values. FIG. 7 shows LVDSCK, LVDS(0) to LVDS(2), operations of switches SW0-0 to SW2-0 in the sequencer 21, three types of 8-bit parallel digital data values DATA0 to DATA2, and clock CK0.

LVDS(0) to be input to the receiver 20a is a serial signal which changes from data D0[7] to data D0[0] and then, changes from data D1[3] to data D1[0]. Moreover, LVDS(2) to be input to the receiver 20c is a serial signal which changes from data D1[7] to data D1[4] and then changes from data D2[7] to data D2[0]. Nothing is input to the receiver 20b.

In the case of this example, the switch SW2-1 is changed from on to off at the timing at which the switch SW2-0 in the sequencer circuit 11 is changed from off to on. Moreover, the switch SW0-0 is changed from on to off at the timing at which the switch SW0-1 in the sequencer circuit 11 is changed from off to on.

Therefore, data values D0[7] to D0[0] are input to the serial/parallel conversion circuit 22a, data values D1[7] to D1[0] are input to the serial parallel circuit 22b, and data values D2[7] to D2[0] are input to the serial/parallel conversion circuit 22c and these data values are converted into parallel signals.

Accordingly, original 8-bit parallel digital data values DATA0[7]-[0], digital data values DATA1[7]-[0], and digital data values DATA2[7]-[0] are obtained by outputs of the serial/parallel conversion circuits 22a to 22c.

(Reception of Serial Data by One Signal Line)

FIG. 8 is a time chart showing operations for receiving serial data by one (M=1) signal line and outputting three types of 8-bit parallel data values. FIG. 8 shows LVDSCK, LVDS(0) to LVDS(2), switches SW0-0 to SW0-2 in the sequencer 21, three types of 8-bit parallel digital data values DATA0 to DATA2, and clock CK0.

LVDS(0) to be input to the receiver 20a is a serial signal which changes from D2[7] to D2[0] and then, changes from data D1[3] to D1[0], and moreover changes from data D0[7] to D0[0]. Nothing is input to the receivers 20b and 20c.

In the case of this example, the switch SW0-2 is changed from on to off at the timing at which the switch SW0-1 in the sequencer circuit 11 is changed from off to on. Moreover, the switch SW0-1 is changed from on to off at the timing at which the switch SW0-0 in the sequencer circuit 11 is changed from off to on.

Therefore, data values D0[7] to D0[0] are input to the serial/parallel conversion circuit 22a, data values D1[7] to D1[0] are input to the serial/parallel conversion circuit 22b, and data values D2[7] to D2[0] are input to the serial/parallel conversion circuit 22c and these data values are converted into parallel signals.

Accordingly, original 8-bit parallel digital data values DATA0[7]-[0], digital data values DATA1[7]-[0], and digital data values DATA2[7]-[0] are obtained by outputs of the serial/parallel conversion circuits 22a to 22c.

Cases of M=1, 2, and 3 at N=3 are described in an LVDS system for converting N types (N is a natural number; the same is applied hereafter) of parallel signals are converted into serial signals and sending/receiving the converted serial signals between driver and a receiver through M (M≦N, the same is applied hereafter) signal lines. However, values of N and M are not restricted to the above values. It is possible to select the number of channels and a data rate optimum for the impedance of a signal line.

As described above, according to the present invention, it is possible to select the number of channels and a data rate optimum for the impedance of a signal line without fixing the number of signal lines used for transmission/reception. Therefore, the present invention is preferably used to prevent a signal error due to the influence of external noises.

What is claimed is:

1. A serial transmission system for converting N parallel signals (where N is a natural number) into serial signals and for sending the converted serial signals from at least one driver to at least one receiver through M signal lines (where M is a positive integer and $M \leq N$), the system comprising:
   transmission-side switching selection means for selecting the driver to be used in accordance with the number of signal lines M; and
   reception-side switching selection means for selecting the receiver to be used in accordance with the number of signal lines M, wherein
   transmission is performed by using the driver selected by the transmission-side switching selection means and reception is performed by using the receiver selected by the reception-side switching selection means.

2. The system according to claim 1, further comprising:
   parallel/serial conversion means set correspondingly to the N parallel signals at the signal transmission side to convert a corresponding parallel signal into a serial signal; and
   serial/parallel conversion means for converting the serial signal converted by the parallel/serial conversion means into the N parallel signals at the signal reception side, wherein
   the transmission-side switching selection means performs the switching selection operation so as to input the serial signal converted by the parallel/serial conversion means to the selected driver and the reception-side switching selection means performs the switching selection operation so as to input the serial signal received by the selected receiver to the serial/parallel conversion means.

3. A transmission-side circuit of a serial transmission system for converting N parallel signals (where N is a natural number) into serial signals and for sending the converted serial signals from at least one driver to at least one receiver through M signal lines (where M is a positive integer and $M \leq N$), the system comprising:
   transmission-side switching selection means for selecting the driver to be used in accordance with the number of signal lines M, wherein
   transmission is performed by using the driver selected by the transmission-side switching selection means.

4. The circuit according to claim 3, further comprising:
   parallel/serial conversion means set correspondingly to the N parallel signals to convert a corresponding parallel signal into a serial signal, wherein
   the transmission-side switching selection means performs the switching selection operation so as to input the serial signal selected by the the transmission-side switching selection means to the selected driver.

5. A reception-side circuit of a serial transmission system for converting N parallel signals (where N is a natural number) into serial signals and for sending the converted serial signals from at least one driver to at least one receiver through M signal lines (where M is a positive integer and $M \leq N$), the system comprising:
   reception-side switching selection means for selecting the receiver to be used in accordance with the number of signal lines M, wherein
   reception is performed by using the receiver selected by the reception-side switching selection means.

6. The circuit according to claim 5, further comprising:
   serial/parallel conversion means for converting the serial signals converted by the a parallel/serial conversion means into the N parallel signals, wherein
   the reception-side switching selection means performs the switching selection operation so as to input the serial signal received by the selected receiver to the serial/parallel conversion means.

7. The system according to any one of claims 1 or 2, wherein the system transmits a differential signal.

8. The circuit according to any one of claims 3 to 6, wherein the circuit transmits a differential signal.

* * * * *

UNITED STATES PATENT AND TRADEMARK OFFICE
CERTIFICATE OF CORRECTION

PATENT NO. : 7,164,372 B2 Page 1 of 1
APPLICATION NO. : 11/062441
DATED : January 16, 2007
INVENTOR(S) : Seiji Takeuchi It is certified that error appears in the above-identified patent and that said Letters Patent is hereby corrected as shown below:

Claim 6, Column 10, line 27, "by the a" should read -- by a --.

Signed and Sealed this

Twelfth Day of June, 2007

JON W. DUDAS
*Director of the United States Patent and Trademark Office*